United States Patent
Ishiguro et al.

(10) Patent No.: US 7,179,097 B2
(45) Date of Patent: Feb. 20, 2007

(54) ELECTRIC CONNECTION BOX HAVING AN IMPROVED INSULATING STRUCTURE

(75) Inventors: Masaaki Ishiguro, Kakegawa (JP); Kazue Nishihara, Kakegawe (JP); Masataka Amano, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/407,082

(22) Filed: Apr. 20, 2006

(65) Prior Publication Data

US 2006/0240691 A1 Oct. 26, 2006

(30) Foreign Application Priority Data

Apr. 25, 2005 (JP) ............................ P2005-126278

(51) Int. Cl.
*H01R 12/00* (2006.01)
(52) U.S. Cl. ..................................... 439/76.2; 439/949
(58) Field of Classification Search ............... 439/76.2, 439/949
See application file for complete search history.

(56) References Cited

U.S. PATENT DOCUMENTS 6,629,850 B2 * 10/2003 Kato et al. ................. 439/76.2

FOREIGN PATENT DOCUMENTS

JP 2004-120907 A 4/2004

* cited by examiner

*Primary Examiner*—Tho D. Ta
(74) *Attorney, Agent, or Firm*—Sughrue Mion, PLLC

(57) ABSTRACT

An electric connection box includes a first wiring board having first insulating ribs formed thereon, and a second wiring board having through hole portions (for respectively passing the first insulating ribs therethrough) formed respectively at regions of insulating of circuits from each other. The first wiring board and the second wiring board are stacked together, and are received within covers. The first insulating ribs of the first wiring board project respectively through the hole portions of the second wiring board to insulate the circuits of the second wiring board from each other.

2 Claims, 10 Drawing Sheets

ELECTRIC CONNECTION BOX HAVING AN IMPROVED INSULATING STRUCTURE

BACKGROUND OF THE INVENTION

1. Field of the Invention

This invention relates to an electric connection box (i.e., an electric junction block) used in the wiring within a vehicle such as an automobile, and more particularly to an improved mechanism for insulating circuits from each other.

2. Related Art

In one conventional electric connection box, a separation rib is disposed between a plurality of circuits (received within the electric connection box) in order to prevent the short-circuiting between the circuits (see, for example, JP-A-2004-120907 Publication).

FIG. 9 shows another conventional electric connection box in which a plurality of insulating ribs 83 are molded integrally on a cover 81 of the electric connection box, and when this cover 81 is combined with a wiring board 82, the insulating ribs 83 are inserted respectively into holes 85 formed respectively at insulating portions or regions 84 of the wiring board 82.

However, the positions (that is, the arrangement) of the insulating regions of the wiring board vary according to a circuit construction (that is, a pattern of installation of conductors such as wires, bus bars and so on). Therefore, the cover, having the insulating ribs molded integrally therewith, can be used only in the electric connection box of a specified circuit construction since the cover does not have commonality. Namely, it is necessary to prepare a plurality of kinds of covers, having different arrangements of insulating ribs, so as to meet a plurality of kinds of wiring boards of different circuit constructions. Therefore, it is necessary to prepare a cover-forming mold in order only to meet a change in arrangement of the insulating ribs. As a result, the cost of production of the mold has increased, and the cost of the cover itself has increased.

SUMMARY OF THE INVENTION

This invention has been made in view of the above circumstances, and an object of the invention is to provide an electric connection box which can be formed, using a single kind of cover having commonality.

The above object has been achieved by an electric connection box of the present invention having features recited in the following Paragraphs (1) to (3).

(1) An electric connection box comprising:
a cover for receiving wiring boards therein;
a first wiring board having at least one first insulating rib formed thereon; and
a second wiring board having at least one through hole portion formed at region for insulation;
wherein the first wiring board and the second wiring board are stacked together, and are received within the cover, and the first insulating rib of the first wiring board projects through the hole portion of the second wiring board to insulate a circuit of the second wiring board.

(2) The electric connection box of the above Paragraph (1), characterized in that at least one second rib is formed on the second wiring board; and
the first wiring board has at least one through hole portion formed at region for insulation; and
the second insulating rib projects through the hole portion of the first wiring board to insulate a circuit of the first wiring board.

(3) The electric connection box of the above Paragraph (2), characterized in that the first insulating rib is molded integrally on the first wiring board, and the second insulating rib is molded integrally on the second wiring board.

The invention of the above Paragraph (1) is directed to the electric connection box wherein the wiring boards are received within the cover; and the electric connection box comprises the first wiring board having the first insulating ribs formed thereon, and the second wiring board having the through hole portions formed respectively at the regions of insulating of the circuits from each other, the first insulating ribs being adapted to pass respectively through the hole portions; and the first wiring board and the second wiring board are stacked together, and are received within the cover, and the first insulating ribs of the first wiring board project respectively through the hole portions of the second wiring board to insulate the circuits of the second wiring board from each other. Therefore, in this electric connection box, there is no need to form any insulating rib on the cover. Therefore, the cover has commonality, and it is only necessary to prepare a single kind of cover for a plurality of kinds of wiring boards of different circuit constructions. And besides, it is necessary to prepare only one kind of cover-forming mold, and therefore the cost of production of the mold can be reduced, and the cost of the cover itself can be reduced. Furthermore, the cost of a material for the cover-forming mold is reduced, and therefore resources can be saved, which is desirable from an ecological point of view.

In the invention of the above Paragraph (2), the second ribs are formed on the second wiring board; and the first wiring board has the through hole portions formed respectively at the regions of insulating of circuits from each other, the second insulating ribs being adapted to pass respectively through the hole portions of the first wiring board; and the second insulating ribs project respectively through the hole portions of the first wiring board to insulate the circuits of the first wiring board from each other. In this electric connection box, the plurality of circuits, formed on the first wiring board, are insulated from each other by the insulating ribs formed on the second wiring board, while the plurality of circuits, formed on the second wiring board, are insulated from each other by the insulating ribs formed on the first wiring board. This construction is desirable.

In the invention of the above Paragraph (3), the first insulating ribs are molded integrally on the first wiring board, and the second insulating ribs are molded integrally on the second wiring board. In this case, the electric connection box can be more easily assembled as compared with the case where the first insulating ribs and the second insulating ribs are formed separately from the first wiring board and the second wiring board, respectively, and then are mounted on the first and second wiring boards, respectively. Therefore, this construction is desirable. And besides, the cost of production of each of the first and second wiring boards can be reduced, and therefore this is desirable. Incidentally, in the production of a plurality of wiring boards of different circuit constructions, the formation of the first insulating ribs and the hole portions at the first wiring board and the formation of the second insulating ribs and the hole portions at the second wiring board hardly lead to the increase of the cost.

In the present invention, even when there are used wiring boards different in conductor-installation pattern, a single kind of cover (that is, a cover of a predetermined shape) can be used in common, and therefore the production cost of the electric connection box can be reduced.

The present invention has been briefly described above. Details of the invention will become more manifest upon reading the following sections with reference to the accompanying drawings.

DETAILED DESCRIPTION OF THE PREFERRED EMBODIMENTS

A preferred embodiment of the present invention will now be described in detail with reference to FIGS. 1 to 8.

Figure 1:
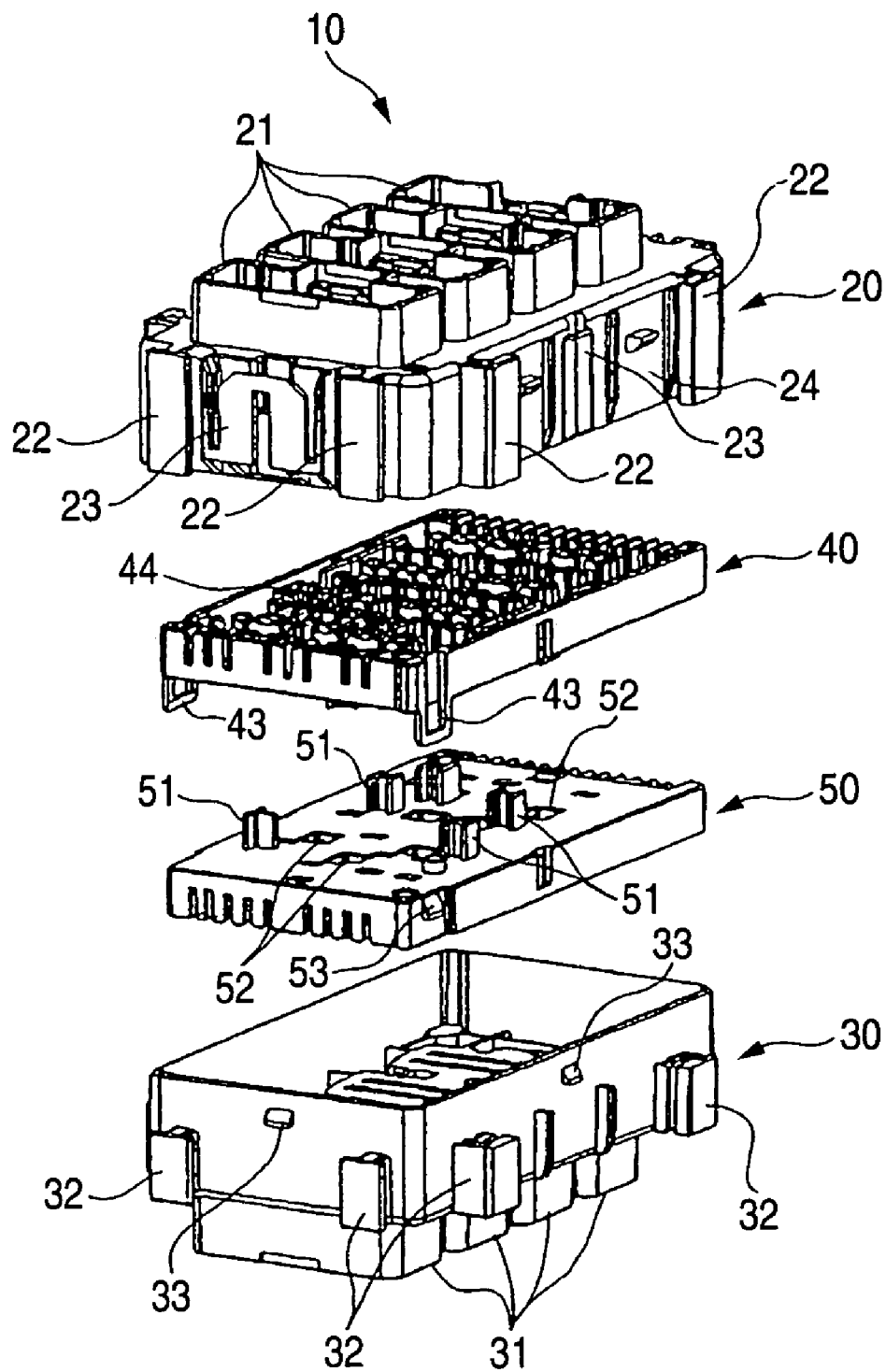
FIG. 1 is an exploded, perspective view of one preferred embodiment of an electric connection box of the present invention.
Figure 2:
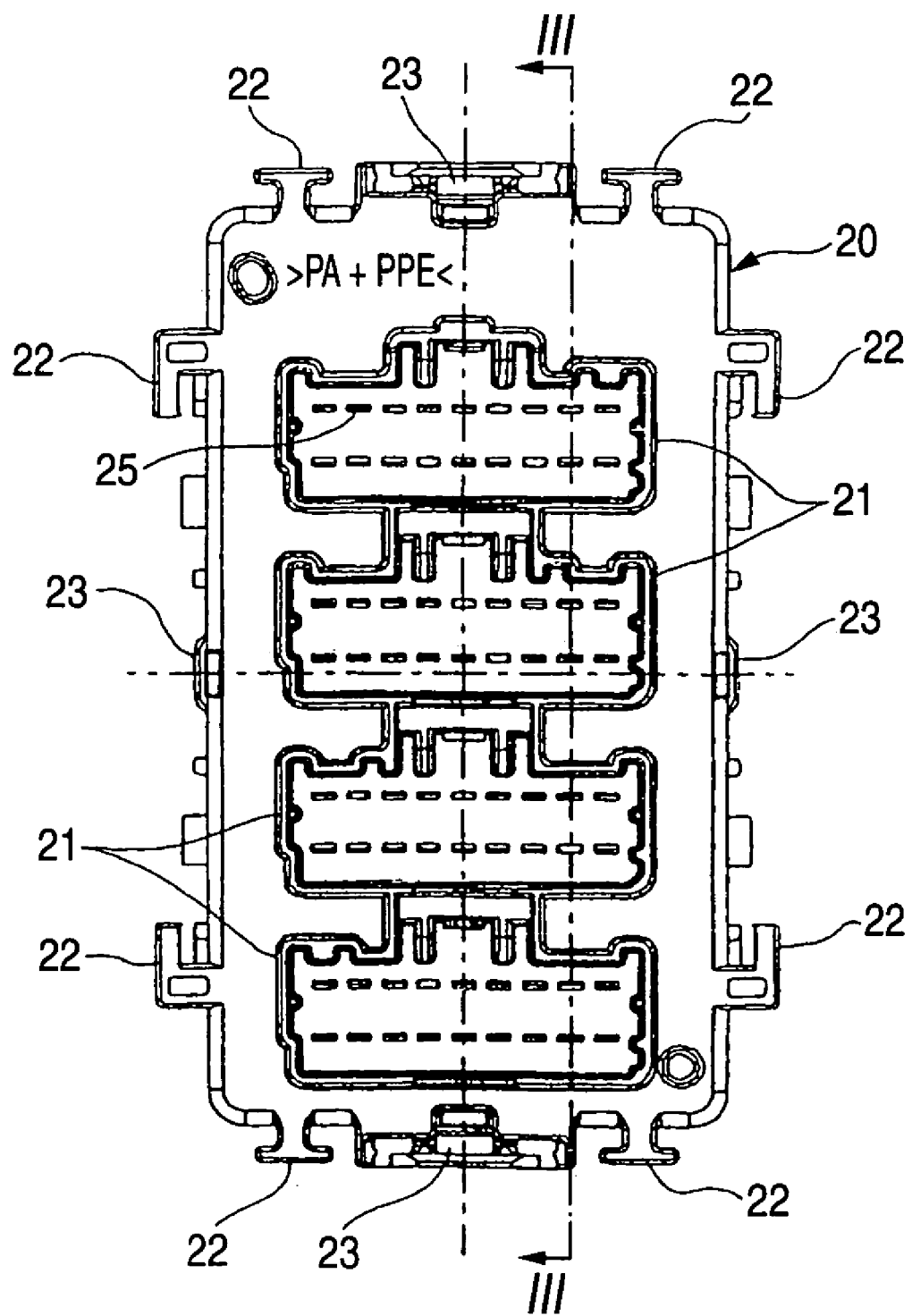
FIG. 2 is a front-elevational view of the electric connection box of FIG. 1 in its assembled condition.
Figure 3:
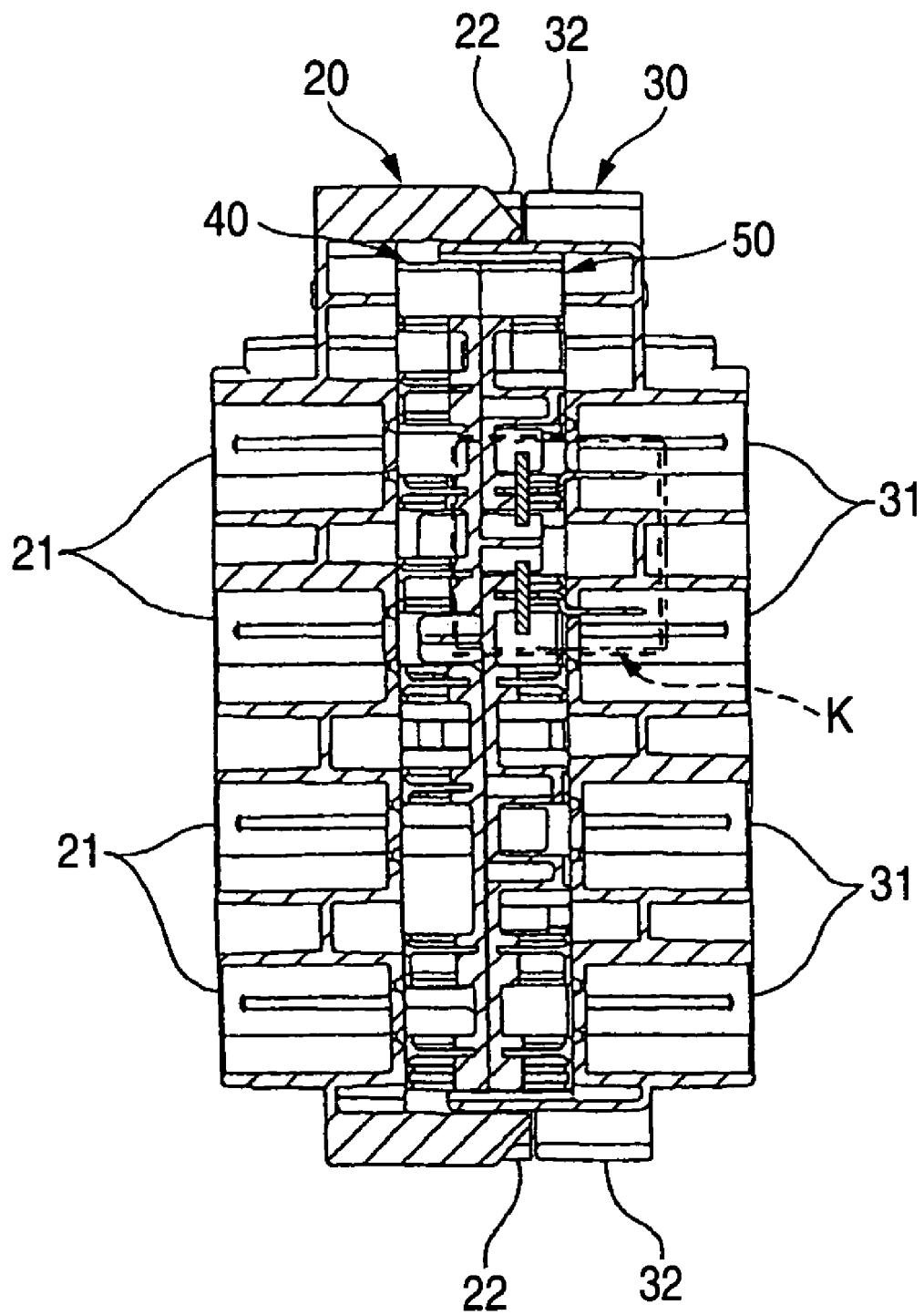
FIG. 3 is a cross-sectional view taken along the line III—III of FIG. 2.
Figure 4:
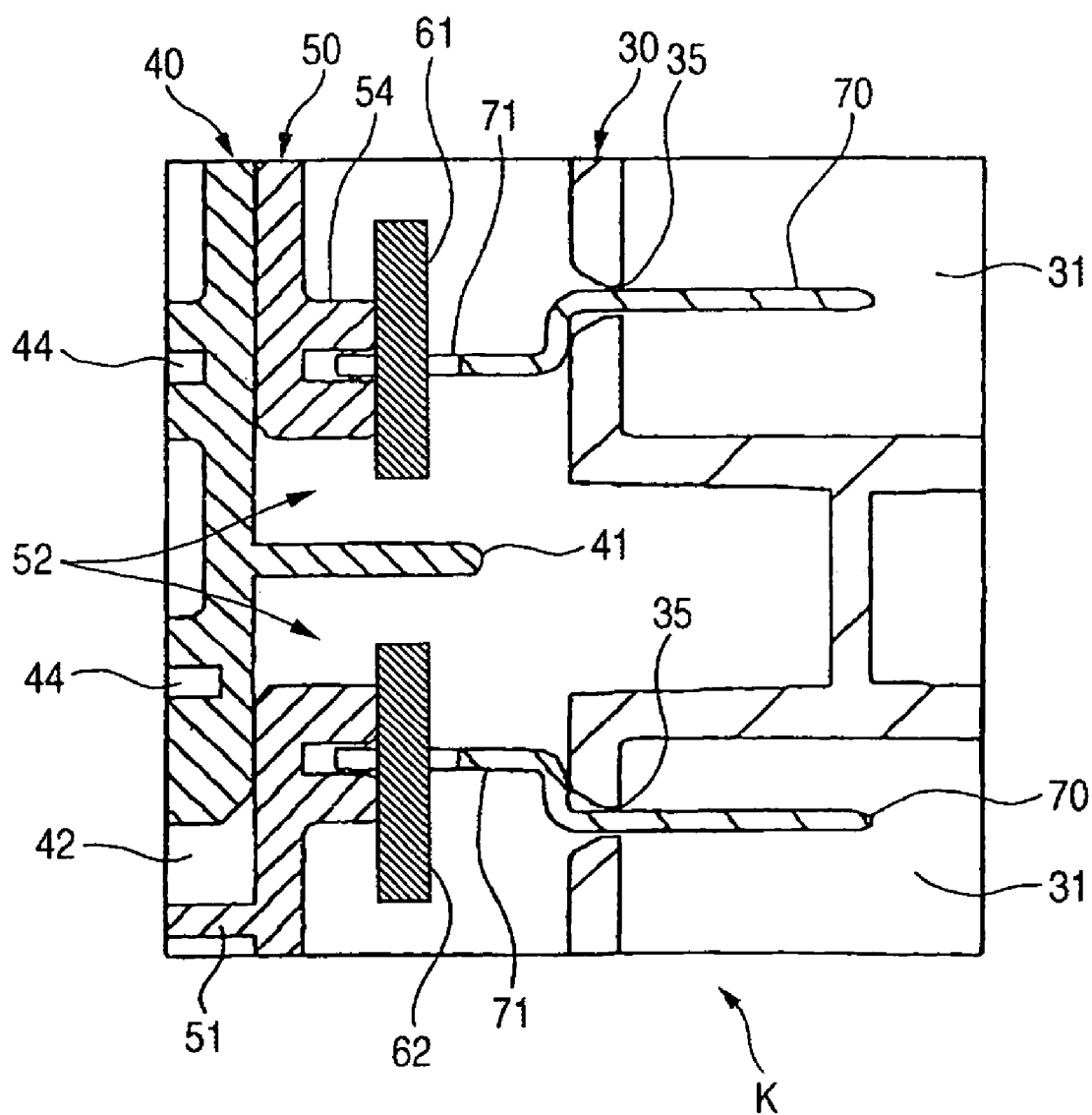
FIG. 4 is an enlarged view of a portion K of FIG. 3.
Figure 5:
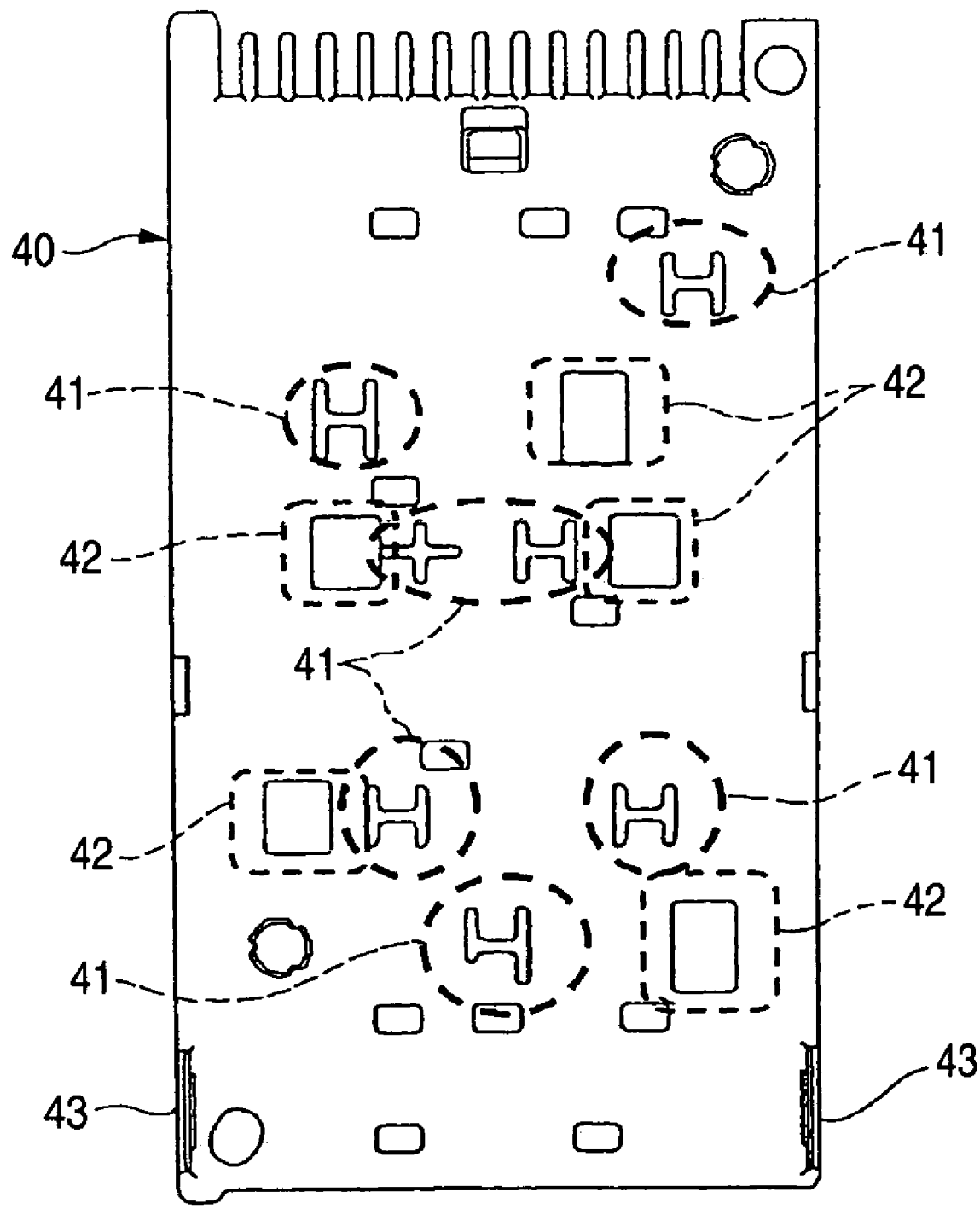
FIG. 5 is a view showing a reverse surface of a first wiring board.
Figure 6:
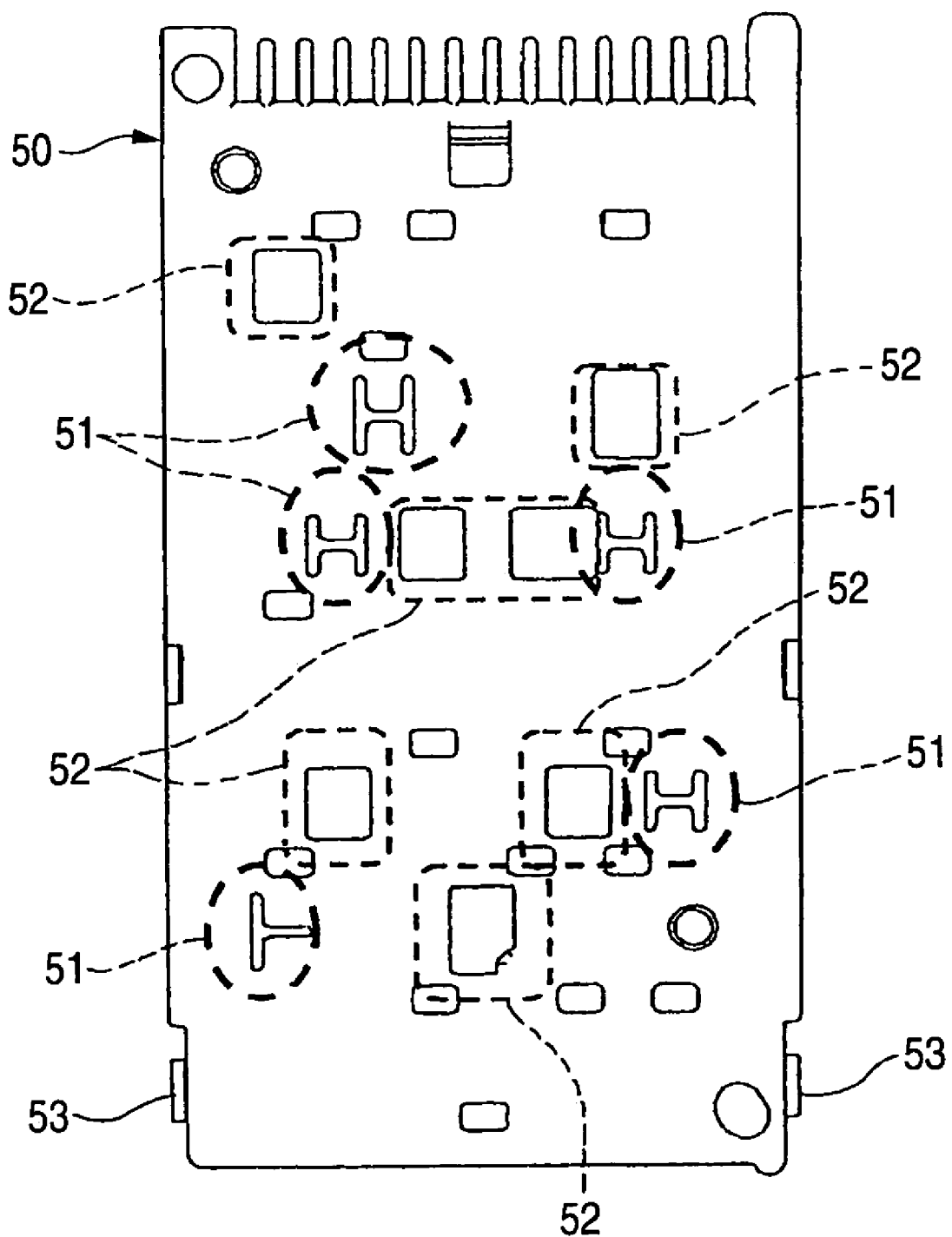
FIG. 6 is a view showing a reverse surface of a second wiring board.
Figure 7:
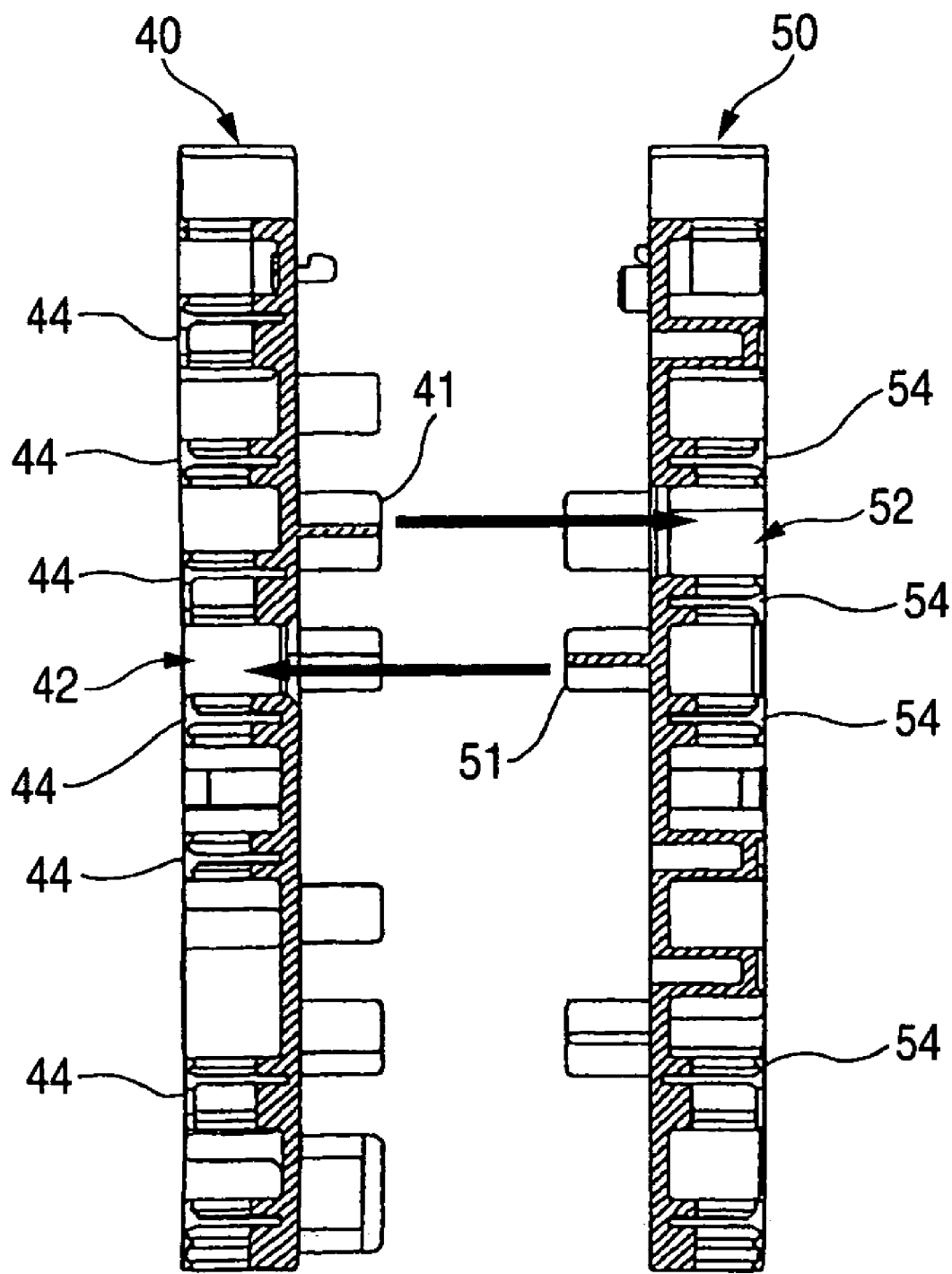
FIG. 7 is a vertical cross-sectional view showing the first wiring board and the second wiring board.
Figure 8:
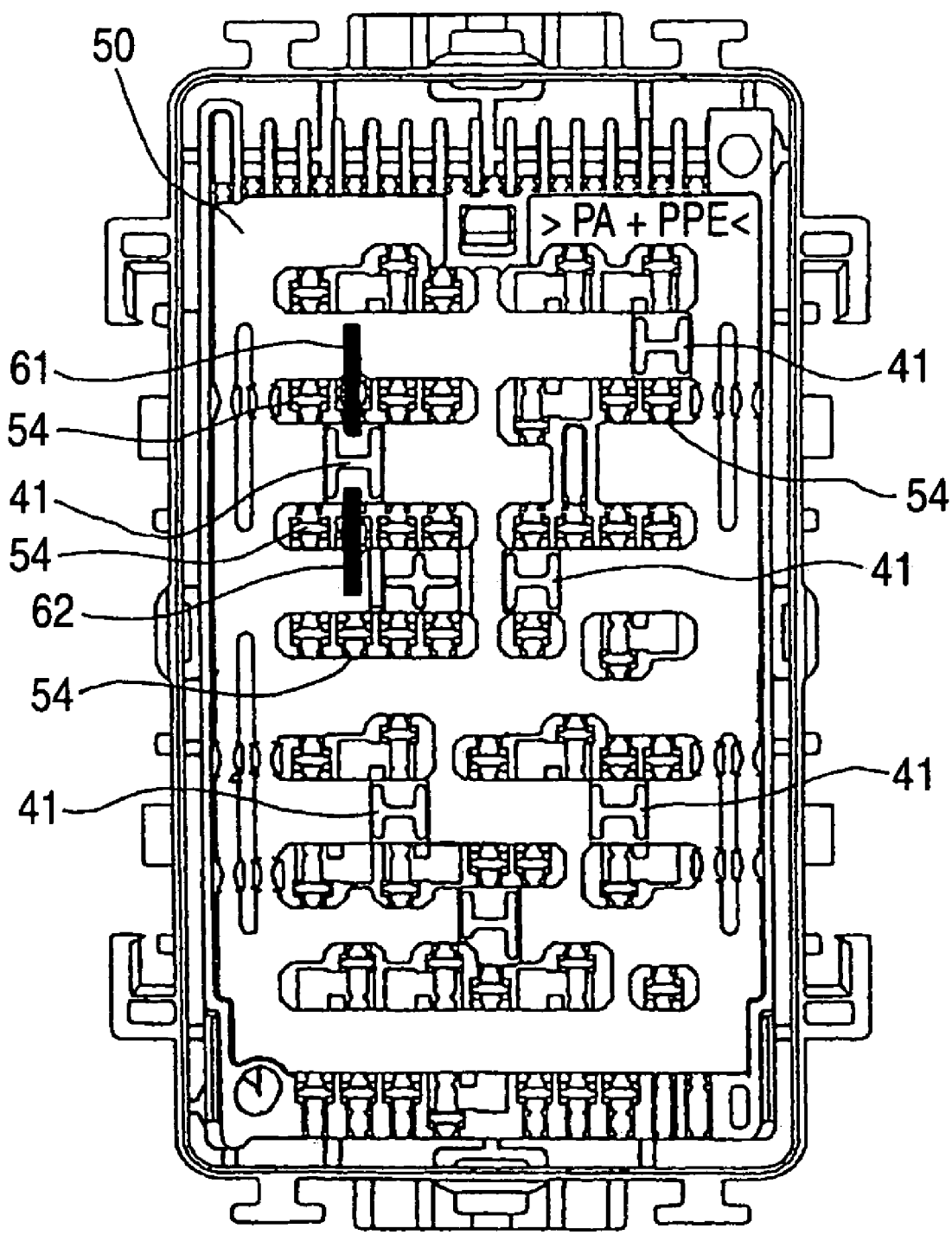
FIG. 8 is a view showing a front surface of the second wiring board combined to the first wiring board.
Figure 9:
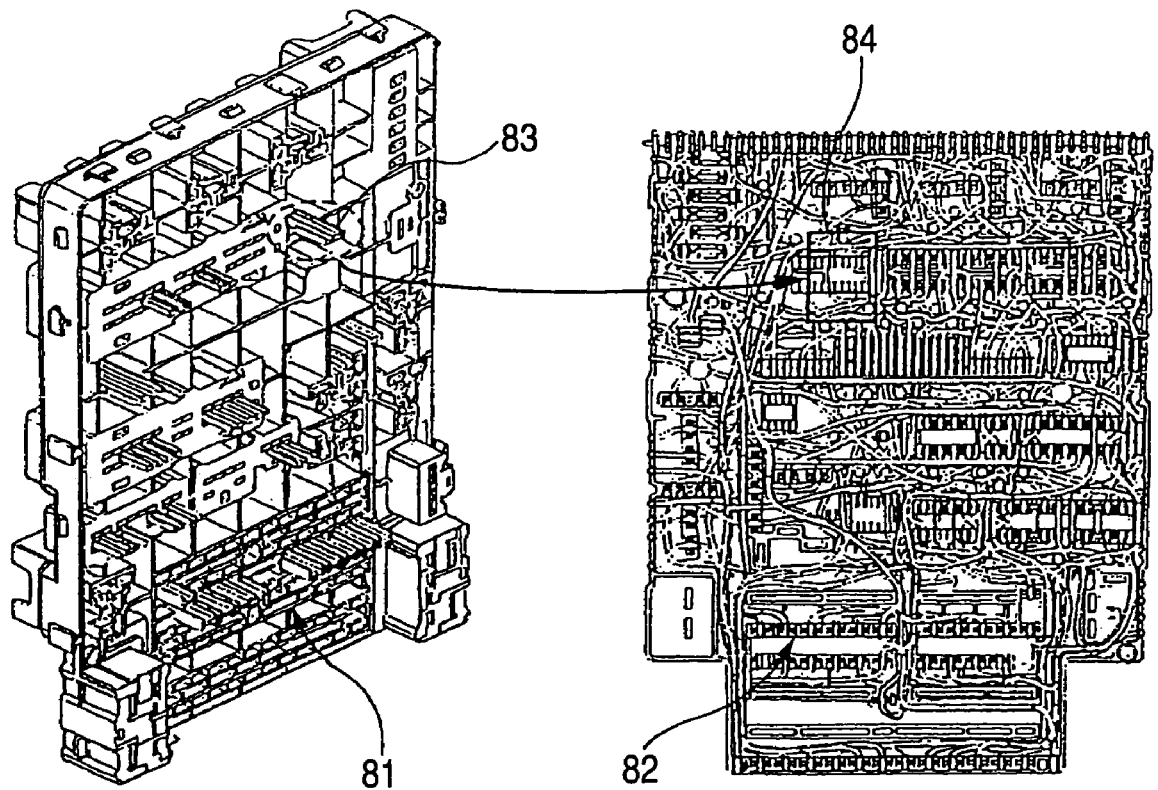
FIG. 9 is an exploded, perspective view of one conventional electric connection box.
Figure 10:
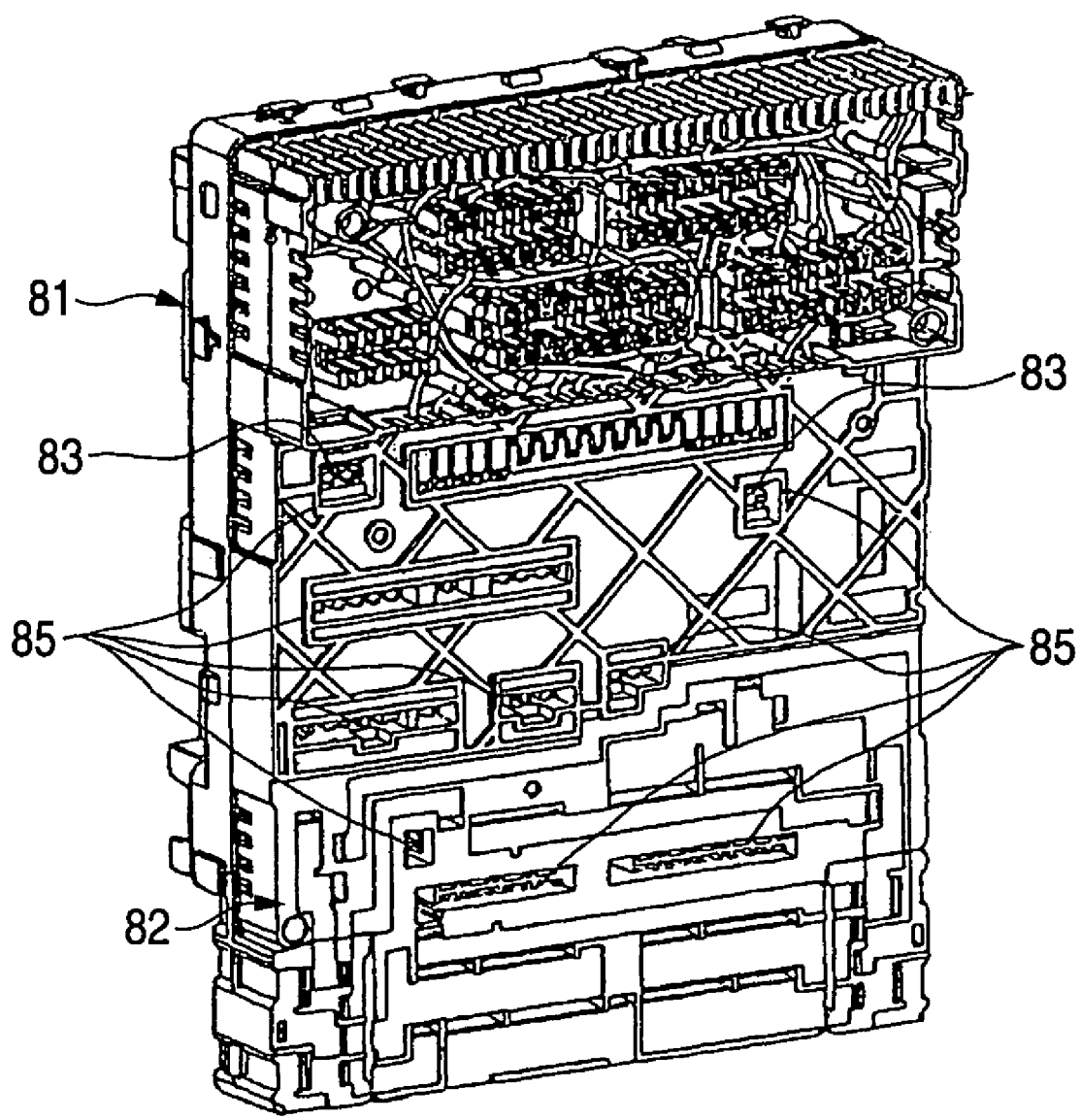
FIG. 10 is a perspective view showing the conventional electric connection box.

FIG. 1 is an exploded, perspective view of one preferred embodiment of an electric connection box 10 of the invention, FIG. 2 is a front-elevational view of the electric connection box 10 of FIG. 1 in its assembled condition, FIG. 3 is a cross-sectional view taken along the line III—III of FIG. 2, FIG. 4 is an enlarged view of a portion K of FIG. 3, FIG. 5 is a view showing a reverse surface of a first wiring board 40 which is to be combined with a second wiring board 50, FIG. 6 is a view showing a reverse surface of the second wiring board 50 which is to be combined with the first wiring board 40, FIG. 7 is a vertical cross-sectional view showing the first wiring board 40 and the second wiring board 50 which are just to be combined together, and FIG. 8 is a view showing a front surface of the second wiring board 50 combined with the first wiring board 40.

As shown in FIG. 1, the electric connection box 10 comprises a first cover 20, a second cover 30, the first wiring boar 40, and the second wiring board 50. The first wiring board 40 and the second wiring board 50 are combined together, and are received within the second cover 30, and the first cover 20 is fitted on the second cover 30 to cover the same.

The first cover 20 includes a base body (that is, a base housing) molded of an insulative resin, and four connector mounting portions 21 are formed on a top surface of this base body surrounded at its four sides by a side wall 24 thereof. Each connector mounting portion 21 has a plurality of terminal insertion holes 25 (see FIG. 2). Engagement reception portions 23 for engagement with respective engagement projections 33 of the second cover 30 are formed on the side wall 24 of the base body of the first cover 20, and also abutment portions 22 for abutting against respective abutment portions 32 of the second cover 30 are formed on the side wall 24.

The second cover 30 includes a base body (that is, a base housing) molded of an insulative resin as is the case with the first cover 20, and this second cover 30 has four connector mounting portions 31 formed on a top surface thereof as shown in FIG. 1. The second cover 30 has the engagement projections 33 (for engagement with the respective engagement reception portions 23 of the first cover 20) and the abutment portions 32 (for abutting against the respective abutment portions 22 of the first cover 20) formed on a side wall of the base body thereof.

The second wiring board 50 includes a base body (that is, a base plate) made of an insulative resin, the base body being formed into a plate-like shape having a predetermined thickness. As shown in FIGS. 1, 6 and 7, this base body has hole portions 52 formed therethrough, and insulating ribs 41 (see FIG. 7), formed (more specifically, molded) integrally with a base body of the first wiring board 40, are inserted respectively into these hole portions 52. Insulating ribs 51 for insertion into respective hole portions 42 of the first wiring board 40 are formed on the reverse surface of the base body of the second wiring board 50 which is to be combined with the first wiring board 40. The insulating ribs 51 are formed (or more specifically, molded) integrally with the base body of the second wiring board 50, and therefore form part of the second wiring board 50. As shown in FIG. 8, a plurality of rows of terminal insertion portions 54 (each in the form of a hole-like portion) are formed at the front surface of the second wiring board 50 (that is, the surface facing the second cover 30), and press-contacting blades 71, formed at press-contacting terminals 70 (see FIGS. 3 and 4), are mounted in these terminal insertion portions 54. The hole portions 52 are disposed at required portions between the rows of terminal insertion portions 54. As shown in FIG. 1, engagement projections 53 for engagement with respective engagement reception portions 43 of the first wiring board 40 are formed at a side wall of the base body of the second wiring board 50.

The first wiring board 40 is similar in construction to the second wiring board 50, and the base body (that is, the base plate) of this first wiring board 40 is made of an insulative resin, and is formed into a plate-like shape having a predetermined thickness. As shown in FIG. 5, the first wiring board 40 has the hole portions 42 into which the insulating ribs 51 of the second wiring board 50 are inserted. The insulating ribs 41 for insertion into the hole portions 52 of the second wiring board 50 are formed at the reverse surface of the first wiring board 40. As shown in FIG. 1, a plurality of rows of terminal insertion portions. 44 are formed on the front surface of the first wiring board 40. The engagement reception portions 43 for engagement with the respective engagement projections 53 of the second wiring board 50 are formed at a side wall of the base body of the first wiring board 40.

As shown in FIGS. 4 and 8, wires 61 and 62 (which are installed on the second wiring board 50), respectively forming two different circuits, are electrically connected at their end portions to the press-contacting terminals 70. At this time, there is carried out an operation in which each wire 61, 62 is gripped by the V-shaped press-contacting blade 71 of the press-contacting terminal 70, and then the press-contact ing blade 71 is press-fitted into the terminal insertion portion 54. As a result, each press-contacting blade 71 cuts a sheath of the wire 61, 62, and is electrically connected to a conductor of the wire 61, 62. The end portion of the wire 61, 62 is mechanically fixed to the terminal insertion portion 54 by the press-contacting blade 71.

A similar operation is carried out for all of the selected terminal insertion portions 44 (see FIG. 4) of the first wiring board 40 and all of the selected terminal insertion portions 54 of the second wiring board 50, and the wires of the circuits are fixed respectively to the selected terminal insertion portions 44 and 54, and also are electrically connected respectively to the press-contacting terminals 70.

Next, a procedure of assembling this electric connection box will be described.

First, the wires of the circuits are installed on the front surface of the base body of the first wiring board 40, and the press-contacting blades 71 of the press-contacting blades 70 are press-fitted respectively into the selected terminal insertion portions 44, thereby fixing the wires 61 and 62 of the circuits. A similar operation is carried out for the second wiring board 50.

Then, the first wiring board 40 and the second wiring board 50 are combined together, with their reverse surfaces mated with each other. At this time, the insulating ribs 41 of the first wiring board 40 pass respectively through the hole portions 52 of the second wiring board 50 as shown in FIGS. 4 and 7, so that each insulating rib 41 project to be disposed between the two wires 61 and 62, thereby insulating the two wires 61 and 62 from each other as shown in FIGS. 4 and 8.

Similarly, the insulating ribs 51 of the second wiring board 50 project respectively through the hole portions 42 of the first wiring board 40, so that each insulating rib 51 insulate the wires (installed on the first wiring board 40) of the different circuits from each other. The engagement reception portions 43 of the first wiring board 40 are engaged respectively with the engagement projections 53 of the second wiring board 50, thereby maintaining the combined condition of the first and second wiring boards 40 and 50.

Then, the thus combined first and second wiring boards 40 and 50 are received within the second cover 30, with the second wiring board 50 facing the second cover 30. At this time, the combined wiring boards 40 and 50 are received within the second cover 40 in such a manner that distal end portions of the press-contacting terminals 70, fixed to the second wiring board 50, project through respective terminal insertion holes 35 formed in the connector mounting portions 31 of the second cover 30, as shown in FIG. 4.

Then, the first cover 20 is attached to the second cover 30 to close the same. At this time, the first cover 20 is attached to the second cover 30 in such a manner that distal end portion of the press-contacting terminals 70, fixed to the first wiring board 40, project through the respective terminal insertion holes 25 formed in the connector mounting portions 21 of the first wiring board 40.

The abutment portions 22 of the first cover 20 abut respectively against the abutment portions 32 of the second cover 30, and also the engagement projections 33 of the second cover 30 are engaged respectively with the engagement reception portions 23 of the first cover 20, thereby maintaining a connected condition of the first and second covers 20 and 30.

Thus, in the electric connection box 10, the insulating ribs 41, 51 of one of the two wiring boards 40 and 50 are caused to project through the hole portions of the other of the two wiring boards 40 and 50, and each projected insulating rib insulates the wires (installed on the other of the two wiring boards 40 and 50) of the different circuits from each other. Therefore, the short-circuiting between the circuits can be positively prevented.

In this embodiment, although each of the two wiring boards 40 and 50 has the insulating ribs 41, 51, insulating ribs can be formed on one of the two wiringboards. For example, there can be provided a modified electric connection box comprising a first wiring board 40 having insulating ribs 41 formed thereon, and a second wiring board 50 having through hole portions 52 (for respectively passing the first insulating ribs 41 therethrough) formed respectively at regions of insulating of circuits from each other, and the first wiring board 40 and the second wiring board 50 are stacked together, and are received within the covers 20 and 30, and the first insulating ribs 41 of the first wiring board 40 project respectively through the hole portions 52 of the second wiring board 50 to insulate the circuits of the second wiring board 50 from each other. There can be provided another modified electric connection box in which through hole portions 42 are formed through a first wiring board 40, while insulating ribs 51 are formed on a second wiring board 50.

In the electric connection box 10 of this embodiment, there is no need to form any insulating rib on the two covers 20 and 30. Therefore, the covers 20 and 30 have commonality, and it is only necessary to prepare a single kind of cover (comprising the covers 20 and 30) for a plurality of kinds of wiring boards of different circuit constructions. And besides, it is necessary to prepare only one kind of cover-forming mold, and therefore the cost of production of the mold can be reduced, and the cost of the cover itself can be reduced. Furthermore, the cost of a material for the cover-forming mold is reduced, and therefore resources can be saved, which is desirable from an ecological point of view.

Furthermore, in the electric connection box 10, the first insulating ribs 41 are molded integrally on the first wiring board 40, and the second insulating ribs 51 are molded integrally on the second wiring board 50. Therefore, the electric connection box can be more easily assembled as compared with the case where the first insulating ribs 41 and the second insulating ribs 51 are formed separately from the first wiring board 40 and the second wiring board 50, respectively, and then are mounted on the first and second wiring boards 40 and 50, respectively. Therefore, this construction is desirable. And besides, the cost of production of each of the first and second wiring boards can be reduced, and therefore this is desirable. Incidentally, in the production of a plurality of wiring boards of different circuit constructions, the formation of the first insulating ribs 41 and the hole portions 42 at the first wiring board 40 and the formation of the second insulating ribs 51 and the hole portions 52 at the second wiring board 50 hardly lead to the increase of the cost.

As described above, in the present invention, even when a plurality of kinds of electric connection boxes which are different in conductor-installation pattern of wiring boards are to be produced, a single kind of cover (that is, a cover of a predetermined shape) can be used in common, and therefore the production cost of each electric connection box can be reduced. Therefore, the electric connection box of the invention, having these advantages, can be extensively used in various vehicles, etc.

The present invention is not limited to the above embodiment, and suitable modifications, improvements and so on can be made. The material, shape, dimensions, numeral value, form, number, disposition, etc., of each of the constituent elements of the above embodiment are arbitrary, and are not limited in so far as the invention can be achieved.

For example, in the above embodiment, although the wires are used, bus bars can be used instead of the wires. In the case of using such bus bars, each bus bar is formed by pressing an electrically-conductive metal sheet, and each resulting bus bar has press-contacting terminals formed integrally therewith.

What is claimed is:

1. An electric connection box comprising:
   a cover for receiving wiring boards therein;
   first wiring board having at least one first insulating rib formed thereon; and
   a second wiring board having at least one through hole portion formed at region for insulation;
   wherein said first wiring board and said second wiring board are stacked together, and are received within said cover, and said first insulating rib of said first wiring board projects through said hole portion of said second wiring board to insulate a circuit of said second wiring board, wherein:
   at least one second rib is formed on said second wiring board;
   said first wiring board has at least one through hole portion formed at region for insulation; and
   said second insulating rib projects through said hole portion of said first wiring board to insulate a circuit of said first wiring board.

2. An electric connection box according to claim 1, wherein said first insulating rib is molded integrally on said first wiring board, and said second insulating rib is molded integrally on said second wiring board.

* * * * *